United States Patent

Inoue et al.

[11] Patent Number: 5,502,331
[45] Date of Patent: Mar. 26, 1996

[54] SEMICONDUCTOR SUBSTRATE CONTAINING BULK MICRO-DEFECT

[75] Inventors: Yoko Inoue; Shuichi Samata, both of Yokohama, Japan

[73] Assignee: Kabushiki Kaisha Toshiba, Kawasaki, Japan

[21] Appl. No.: 444,892

[22] Filed: May 19, 1995

Related U.S. Application Data

[63] Continuation of Ser. No. 199,936, Feb. 22, 1994, abandoned.

[30] Foreign Application Priority Data

Feb. 23, 1993 [JP] Japan .................................. 5-033574

[51] Int. Cl.$^6$ .......................... H01L 29/30; H01L 29/167
[52] U.S. Cl. ........................... 257/617; 257/610; 257/611
[58] Field of Search ............................ 257/1, 617, 610, 257/611; 437/10, 939

[56] References Cited

U.S. PATENT DOCUMENTS

| | | | |
|---|---|---|---|
| 4,548,654 | 10/1985 | Tobin | 437/10 |
| 4,597,804 | 7/1986 | Imaoka | 257/617 |
| 4,622,082 | 11/1986 | Dyson et al. | 148/33 |
| 4,637,123 | 1/1987 | Cazcarra et al. | 437/10 |
| 5,066,359 | 11/1991 | Chiou | 156/651 |

FOREIGN PATENT DOCUMENTS 55-96641 7/1980 Japan.
59-202640 11/1984 Japan.

OTHER PUBLICATIONS

Wolf et al. "Silicon Processing For VLSI Era," Lattice Press, Sunset Beach, Calif., 1986, pp. 30–33.
Y. Matsushita, et al; "*Improvement of Silicon Surface Quality by $H_2$ Anneal*"; Extended Abstract of the 18th (1986 International) Conference on Solid State Devices and Materials, Tokyo, 1986; pp. 529–532.

*Primary Examiner*—Mahshid Saadat
*Attorney, Agent, or Firm*—Oblon, Spivak, McClelland, Maier & Neustadt

[57] ABSTRACT

The semiconductor substrate is manufactured by growing a semiconductor crystal in accordance with CZ method; forming a substrate from the semiconductor crystal; and heat treating the formed substrate at 1150° C. or higher for 30 min or longer in non-oxidizing atmosphere (e.g., 1200° C. for 1 hour in hydrogen gas). In the formed wafer, the density of bulk micro-defects is $5 \times 10^2$ to $5 \times 10^6$ pieces per $cm^{-3}$ in the surface area, but $5 \times 10^7$ pieces per $cm^{-3}$ or more in an 20 μm or deeper from the surface. To confirm the depth profile of BMD density, the substrate is further heat treated at 780° C. for 3 hours in oxygen atmosphere and successively at 1000° C. for 16 hours in oxygen atmosphere.

1 Claim, 3 Drawing Sheets 5,502,331

SEMICONDUCTOR SUBSTRATE CONTAINING BULK MICRO-DEFECT

This application is a Continuation of application Ser. No. 08/199,936, filed on Feb. 22, 1994, now abandoned.

BACKGROUND OF THE INVENTION

1. Field of the Invention

The present invention relates to a semiconductor substrate and a method of manufacturing the same, and more specifically to a method of manufacturing a semiconductor substrate, by which the depth distribution of oxygen precipitate in a silicon (Si) wafer in particular can be controlled in order to reduce device failure and thereby to improve the production yield of the devices.

2. Description of the Prior Art

Conventionally, IG (intrinsic gettering) substrates in which BMD (bulk micro-defect) is formed inside the substrate to reduce device failure have been so far used. Here, the BMD implies oxygen precipitate. In the IG substrate, metallic impurities of the wafer surface can be eliminated by gettering these impurities with the use of the BMD, that is, by absorbing these impurities at the BMD located at the positions at which device characteristics are not directly influenced by the BMD. In this method, it is possible to reduce the device failure caused by the generation of crystalline defects and the increase of P-N junction leakage current due to contamination, for instance.

Here, since the gettering efficiency of the IG substrate can be increased in proportion to the BMD density, the high density of BMD in inner region of substrate is desirable.

In the conventional IG substrate, the BMD is formed in the interior of the substrate in accordance with the following method: the substrate is first heat treated at about 1200° C. in an oxidizing atmosphere to form DZ (denuded zone) layer on the surface of the substrate as a non defective layer; and thereafter the substrate is further heat treated at a low temperature of about 800° C. and at a medium temperature of about 1000° C., respectively to form BMD only in the interior of the substrate.

In the conventional method, although it has been so far stated that there exist no defectiveness in the DZ layer, when the DZ layer is inspected minutely, it has been found that the DZ layer still includes BMD of a considerably high density.

FIG. 1A is a graphical representation showing the relationship between the BMD density and the depth from the surface of the conventional substrate, in which the solid line indicates the BMD density distribution of a CZ (Czochralski) substrate formed in a crystalline material grown in accordance with CZ method and the dashed line indicates the BMD density distribution of the IG substrate. In the case of the CZ substrate, the heat treatments at a lower temperature of about 800° C. and a middle temperature of about 1000° C. were carried out to visualize the BMD depth distribution. FIG. 1A indicates that even in the IG substrate there are many BMDs of about $10^7$ to $10^8$ pieces per $cm^3$ even at a region of about 10 µm depth from the surface which is to be a DZ layer of the substrate.

Further, FIG. 1B is the representation of BMD distribution obtained when the conventional IG substrate manufactured in accordance with a predetermined treatment is observed with a microscope on a cross section taken along the depth direction thereof, in which the reference numeral 31 denotes a substrate surface and 32 denotes BMDs. FIG. 1B indicates that a lot of BMDs exist in the region near surface.

In addition, it has been clarified that the BMD formed in the DZ layer (at which no defectiveness is required) cause defective failure.

As already explained, although in order to improve the gettering efficiency of the IG substrate, it is necessary to increase the BMD density, since the BMD density in the DZ layer is also increased with increasing BMD density in the interior of the substrate, there exists a limit in the practical improvement of the gettering capability. However, with the advance of the further microminiaturization of LSIs, the need of solving the above-mentioned problem has increased more and more.

SUMMARY OF THE INVENTION

With these problems in mind, therefore, it is the object of the present invention to provide a semiconductor substrate and a method of manufacturing the same, by which crystalline defects near the substrate surface can be reduced and further the gettering capability can be improved.

To achieve the above-mentioned object, the present invention provides a semiconductor substrate wherein the average density of bulk micro-defects is $5 \times 10^2$ to $5 \times 10^6$ pieces per $cm^3$ from a surface of the substrate to a depth of 10 µm, when observed after the substrate is heat treated at 780° C. for 3 hours in oxygen atmosphere and successively at 1000° C. for 16 hours in oxygen atmosphere.

Further, the density of BMD is $5 \times 10^7$ pieces per $cm^3$ or more in an inner region 20 µm or deeper from the device forming surface.

Further, the present invention provides a method of manufacturing a semiconductor substrate, comprising the steps of: dipping a semiconductor seed crystal of single crystal into a semiconductor melt and pulling up the seed crystal from the semiconductor melt, thus to obtain a semiconductor crystal of the same crystalline orientation as that of the seed crystal; forming a substrate of the crystal grown by the above method; and heat treating the formed substrate at 1150° C. or higher for 30 minutes or longer in a non-oxidizing atmosphere.

In the heat treating step, the heat treatment may be applied to the formed substrate in the non-oxidizing atmosphere of at least any one of H2, CO, $CO_2$, Ar, He, Ne, Kr and Xe.

DETAILED DESCRIPTION OF THE PREFERRED EMBODIMENTS

The embodiment of the present invention will be described below.

Figure 2:
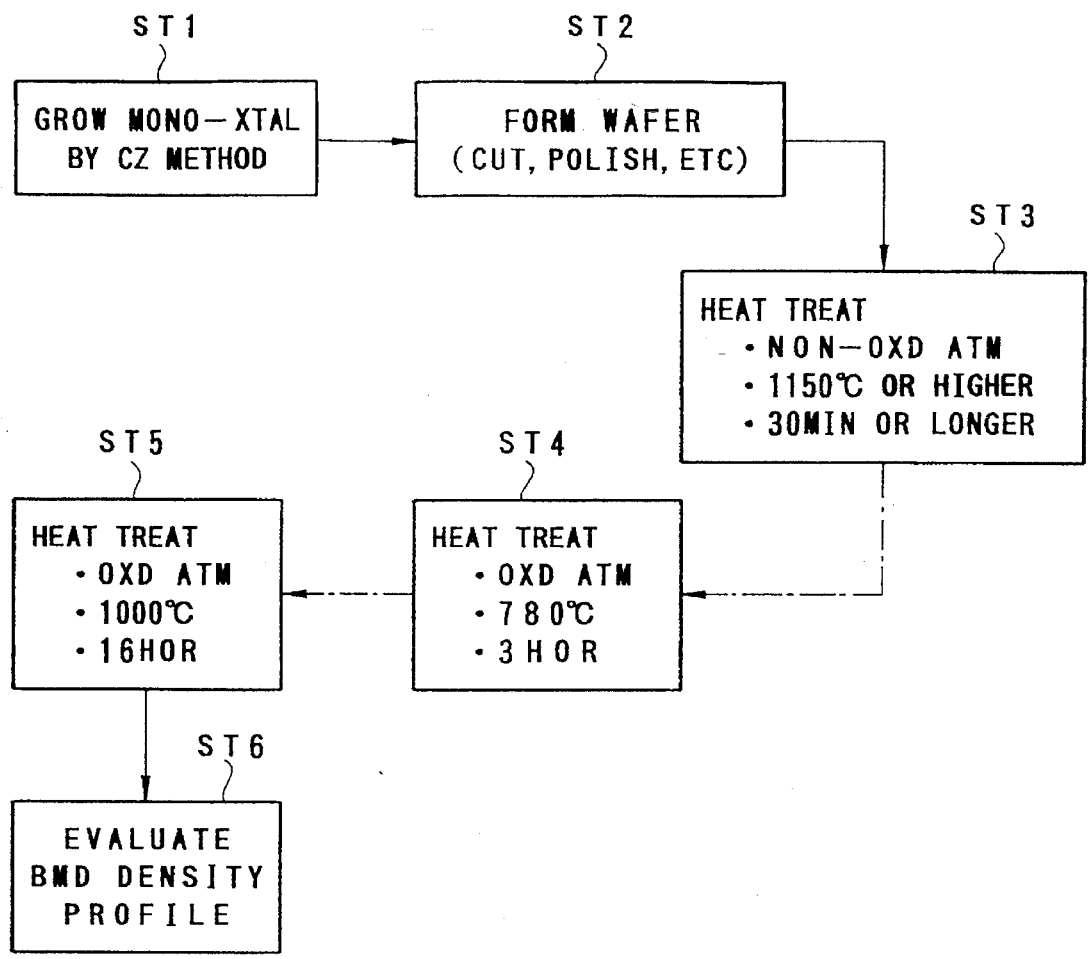
FIG. 2 is a flowchart for explaining the flow of the manufacturing process of an embodiment according to the present invention.

FIG. 2 shows an embodiment of the manufacturing steps of the semiconductor substrate of the present invention. In stage ST1, silicon crystal is grown in accordance with CZ method. Next, in stage ST2, a rod-shaped Si crystal is cut off into a plurality of thin plates with the use of a diamond cutter, for instance. Then, a CZ wafer is formed by etching and polishing the surface of each of the thin plates into mirror surface state.

The Czochralski method will be described as follows. First, polycrystalline silicon as a crystal material is put into a quartz crucible, for example, and is melted. The melted silicon in the crucible is held at the temperature a little higher than the melting point of silicon. Next, a seed crystal of single crystalline silicon is dipped into the melted silicon and is then slowly pulled to obtain a big pillar-like single silicon crystal having the same orientation arrangement as that of the seed crystal.

One modification of the CZ method is Continuous Czochralski (CCZ) method in which silicon material is added into the crucible during the process of silicon crystal growth.

Another modification is Magnetic Czochralski (MCZ) method in which a uniform magnetic field is applied over the melted silicon in the crucible to control the flow generated in the silicon melt.

Still another modification is double-layer Czochralski (DLCZ) method. In this method, a melted silicon layer is put over a solid silicon layer in the crucible. While the solid silicon layer is being melted by controlling the temperature distribution in the crucible, a single crystalline pillar of silicon is grown.

The CZ methods described above, except the DLCZ method, are disclosed in "Status and Future of Silicon Crystal Growth" by Werner Zulehner in Material Science and Engineering, B4 (1989), pages 1 to 10.

The CZ wafer formed in stage 2 is heat treated at the temperature higher than 1150° C. for the time longer than 30 minutes in non-oxidizing atmosphere in stage ST3. For example, the CZ wafer is heat treated at 1200° C. for one hour in hydrogen gas.

Figure 3A:
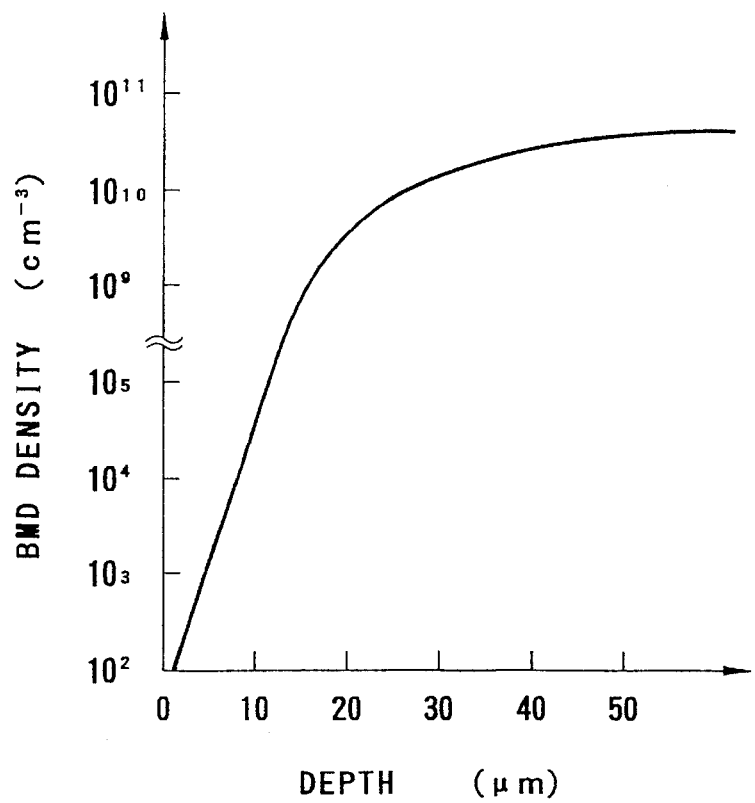
FIG. 3A is a graphical representation showing the depth profile of BMB density in a wafer manufactured in accordance with the method shown in FIG. 2.

According to the above-mentioned stages from ST1 to ST3, it is possible to form the wafer having the depth profile of BMD as shown in FIG. 3A, in which the BMD density is more than $5 \times 10^7$ pieces/cm$^3$ at the interior 20 μm or deeper from the surface 21 of the wafer and between $5 \times 10^2$ and $5 \times 10^6$ pieces/cm$^3$ at the shallower region near the surface 21 thereof.

Figure 3B:
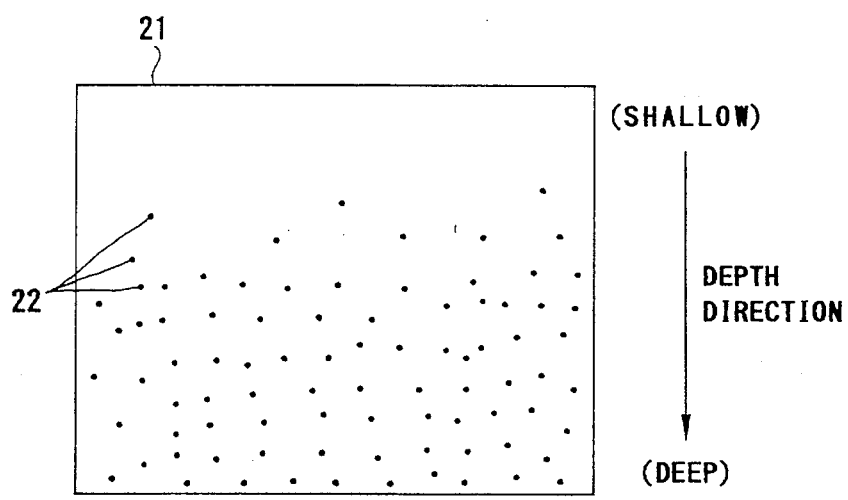
FIG. 3B is an enlarged cross-sectional view showing the depth profile of BMD density in the wafer manufactured in accordance with the method shown in FIG. 2.

The above-mentioned BMD profile can be observed visually as shown in FIG. 3B with the use of an optical microscope, when the wafer is heat treated as follows:

That is, in stage ST4, the wafer is heat treated at 780° C. for 3 hours in oxygen atmosphere. In addition, in stage ST5, the wafer is further heat treated at 1000° C. for 16 hours in oxygen atmosphere. The additional heat treatment in stage ST5 serves to grow the nuclei of BMD formed in stage ST4, and the BMD distribution as shown in FIG. 3B can be observed.

The evaluation of the wafer manufactured in accordance with the present invention has been made in comparison with the wafer manufactured in accordance with the conventional method as follows: As the wafer of the present invention, CZ wafer was heat treated at 1200° C. for 1 hour in pure hydrogen (the same as an example described in stage ST3). Further, as a first conventional sample, CZ wafer was prepared. Further, as a second conventional sample, IG wafer was formed by heat treating the CZ wafer at 1200° C. for 4 hours in $N_2/O_2$ atmosphere. In the present evaluation test, all the wafer samples were heat treated in accordance with the stages ST4 and ST5 shown in FIG. 2, respectively.

Figure 1A:
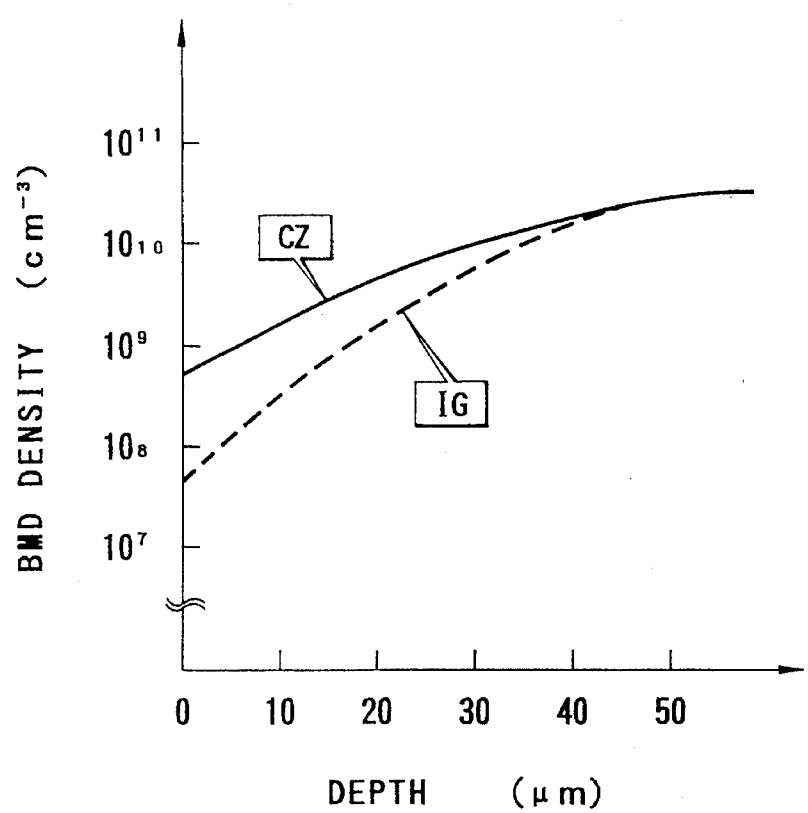
FIG. 1A is a graphical representation showing the depth profile of BMD density in a conventional wafer.
Figure 1B:
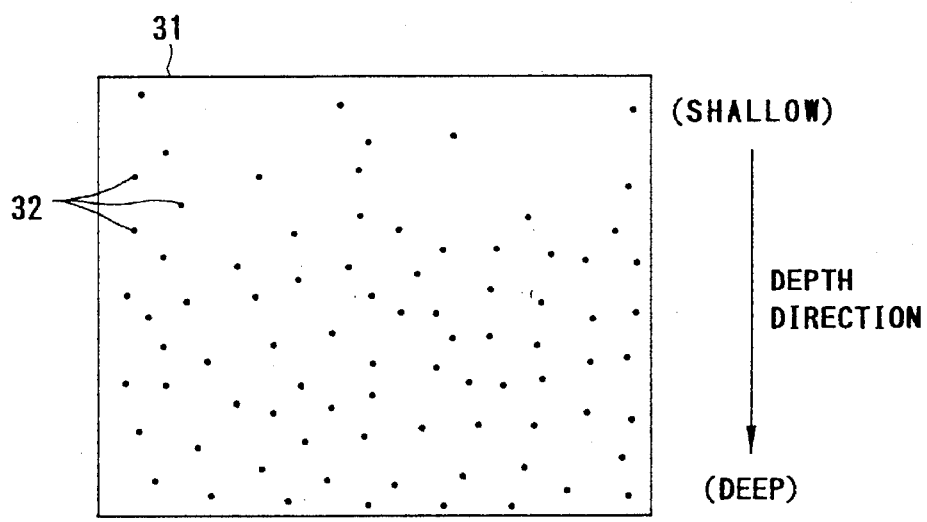
FIG. 1B is an enlarged cross-sectional view showing the depth profile of BMD density in a conventional wafer.

The results of the evaluation test for the wafer of the present invention, the first conventional wafer (CZ wafer) and the second conventional wafer (IG wafer) by infrared tomography method are as follows: In the case of the wafer according to the present invention, a clear DZ (denuded zone) layer was observed, as shown in FIG. 3A. On the other hand, in the case of the first conventional sample (CZ wafer), the surface area BMD density was high as shown in FIG. 1A, and the higher density BMD layer was observed in the deep region of the wafer. In the case of the second conventional sample (IG wafer), although the surface area BMD density was lowered as compared with that of the CZ wafer, as shown in FIG. 1A, the BMD density of the surface area was still higher than that of the wafer of the present invention as shown in FIG. 3A.

Further, 16 M DRAMs were manufactured with the use of the three wafer samples produced in accordance with the method in stages ST1 to ST3 of FIG. 2, the first conventional method and second conventional method, and then the device characteristics of these samples were examined. The examined results are as follows: the production yield of the present invention was the highest; that of the second conventional method was the medium; and that of the first conventional method was the lowest.

In practice, the increase in the production yield of the wafer manufactured in accordance with the present invention was 10%. It was confirmed that the improvement of the production yield was due to the fact that the P-N junction leakage failure and the pause failure indicative of data holding capability caused by crystalline defects on the wafer surface were both reduced. Further, it was also confirmed that the improvement of the production yield was due to the elimination of the decrease in manufacturing yield caused by the contamination in the device manufacturing process because the internal BMD density of the wafer according to the present invention could be increased as compared with that of the conventional wafer.

Further, the wafer of the present invention, the first conventional wafer and the second conventional wafer were all heat treated in accordance with the stages ST4 and ST5, respectively, to examine the depth profile of BMD densities.

The results are listed in Table 1 below. Table 1 shows that only the wafer according to the present invention satisfies the depth profile of BMD densities at which the present invention aims.

TABLE 1

| (BMD DENSITY FROM WAFER SURFACE) | | | |
| --- | --- | --- | --- |
| DEPTH FROM SURFACE | CZ | IG | INVENTION |
| 0–10 μm | $2 \times 10^9$ | $6 \times 10^7$ | $4 \times 10^4$ |
| 10–20 μm | $8 \times 10^9$ | $1 \times 10^9$ | $5 \times 10^6$ |
| 20 μm or deeper | $1 \times 10^{10}$ | $1 \times 10^{10}$ | $3 \times 10^{10}$ |
| | | | (Unit: cm$^{-3}$) |

For the wafer of the present invention, the first conventional wafer and the second conventional wafer, SMD (Surface Micro Defect) as one of surface defects besides BMD, the break down test and TDDB (Time Dependent Dielectric Breakdown) test of thin silicon dioxide were evaluated.

In these evaluation, heat treatments of stages ST4 and ST 5 were not performed. The results are listed in Table 2 below:

TABLE 2

| (EVALUATION TEST RESULTS) | | | |
|---|---|---|---|
| | CZ | IG | INVENTION |
| SMD DENSITY | 1.7 cm$^{-2}$ | 1.10 cm$^{-2}$ | 0.06 cm$^{-2}$ |
| BRAKE DOWN FAILURE RATE | 40% | 30% | 0% |
| ACCIDENTAL FAILURE RATE ON TDDB | 30% | 25% | 0% |

SMD density was evaluated for the respective wafers after treating the wafers by use of SC-1 liquid (ammonia: hydrogen peroxide : water=1:1 to 2:5 to 7) proposed by U.S. RCA Corp. in 1970.

The above Table 2 indicates that the wafer manufactured in accordance with the present invention has low SMD density compared to conventional wafers.

Table 2 further indicates that it is possible by present invention to drastically lower the break down failure and the accidental failure in TDDB test of thin silicon dioxide.

The above test results on the present invention has been confirmed under the heat treatment in stage ST3 of FIG. 2 in non-oxidizing atmosphere such as $H_2$, CO, $CO_2$, At, He, Ne, Kr, Xe, etc or a mixture of either of them.

It is required that the temperature and time period for the heat treatment in stage ST3 are 1150° C. or higher and 30 minutes or longer, respectively, so that the enough out-diffusion of oxygen in silicon wafer will be achieved and the enough decomposition of crystalline defects in the vicinity of the wafer surface will be performed.

However, in the case of the heat treatment in stage ST3, silicon wafer will be melt on or above 1415° C. Thus, the heat treatment in stage ST3 should be performed in the temperature between 1150° C. and 1415° C.

As described above, in the manufacturing method according to the present invention, since the semiconductor substrate has a BMD density profile such that the BMD density is 5×10$^7$ pieces/cm$^3$ or more in the interior 20 μm or deeper from the wafer surface but 5×10$^2$ to 5×10$^6$ pieces/cm$^3$ in the shallower region near the wafer surface of the semiconductor substrate, it is possible to eliminate substantially the defectiveness in the vicinity of the wafer surface and further to realize sufficient gettering capability in the interior of the wafer.

In the case where the average BMD density exceeds 5×10$^6$ pieces/cm$^3$ in the interior 10 μm or less, device failures such as P-N junction leakage increase occur. This problem will occur in the case of the second conventional wafer (IG wafer) and it is more remarkable in the case of the first conventional wafer (CZ wafer).

Contrary to these conventional wafers, the wafer according to the present invention will exhibit the BMD profile as shown in FIG. 3A which depicts a steep curve.

The BMD is actually oxygen precipitate which is $SiO_2$, and the increase in BMD volume will exceed the decrease in consuming silicon volume in the wafer as the BMD grows. Because of this, there exist lattice stress after the growth of the BMD.

The lattice stress near surface ill be larger in the case of steeper BMD profile. And when the lattice stress due to BMD profile is too large, dislocation will be generated on the silicon wafer surface due to thermal stress during the heat treatment in device manufacturing process. This dislocation results in device failure such as P-N junction leakage current increase. In order to avoid such failure, it is considered first to decrease the thermal stress during heat treatment of device fablication process. However, this method will lower the efficiency of device manufacturing.

The present invention has resolved the problems such as lattice stress increase due to the BMD profile without considerably lowering the efficiency of device manufacturing by setting the BMD density in the interior 10 μm or less deep from the wafer surface above 5×10$^2$ pieces/cm$^3$.

It has been confirmed that when the BMD density is less than 5×10$^2$ pieces/cm$^3$ in the interior 10 μm or less deep from the wafer surface, the BMD density in the interior 20 μm or deeper of the wafer becomes 5×10$^7$ pieces/cm$^3$ or less according to a conventional method of silicon crystal growth, causing a poor gettering capability.

It has been further confirmed in the case of 16 MDRAM and gate array that when the BMD density is 5×10$^7$ pieces/cm$^3$ or less in the interior 20μm or deeper from the wafer surface, because of low gettering capability, crystalline defects, such as dislocation or OSF (Oxidation-Induced Stacking Fault), generates due to metallic contamination during the device manufacturing process, causing device failure, such as, P-N junction leakage current increase.

From above result, the BMD density should be 5×10$^7$ pieces/cm$^3$ or more in the interior 20 μm or deeper from the wafer surface.

What is claimed is:

1. A semiconductor substrate containing bulk micro-defects under the condition that the average density of bulk micro-defects of the substrate is within the range of 5×10$^2$ to 5×10$^6$ pieces per cm$^3$ from a surface of the substrate to a depth of 10 μm and a density of bulk micro-defects is above 5×10$^7$ pieces per cm$^3$ in the interior 20 μm or deeper from the surface.

* * * * *